United States Patent [19]

Imanishi et al.

[11] Patent Number: 5,273,791
[45] Date of Patent: Dec. 28, 1993

[54] METHOD OF IMPROVING THE CORROSION RESISTANCE OF A METAL

[75] Inventors: Yuichiro Imanishi; Masatsugu Oshima, both of Nagoya, Japan

[73] Assignee: NGK Insulators, Ltd., Japan

[21] Appl. No.: 795,469

[22] Filed: Nov. 21, 1991

[30] Foreign Application Priority Data

Nov. 21, 1990 [JP] Japan .................. 2-314061

[51] Int. Cl.$^5$ ............................................. B05D 3/06
[52] U.S. Cl. .................... 427/577; 427/248.1; 427/249; 427/327; 427/578; 427/579; 427/585
[58] Field of Search ............. 427/38, 39, 569, 585, 427/577, 578, 579, 248.1, 249, 327

[56] References Cited

U.S. PATENT DOCUMENTS

| | | | |
|---|---|---|---|
| 4,289,822 | 9/1981 | Shimada et al. | 428/212 |
| 4,547,448 | 10/1985 | Shirai et al. | 430/84 |
| 4,555,464 | 11/1985 | Kido et al. | 430/67 |
| 4,687,722 | 8/1987 | Ogawa | 430/59 |
| 4,696,881 | 9/1987 | Saitoh et al. | 430/57 |
| 4,786,574 | 11/1988 | Shirai et al. | 430/66 |

*Primary Examiner*—Bernard Pianalto
*Attorney, Agent, or Firm*—Parkhurst, Wendel & Rossi

[57] ABSTRACT

A composite member includes a structural member having a surface in a mirror-finished condition and a film layer of an amorphous material provided on the surface. The amorphous material is preferably at least one selected from amorphous SiC, amorphous SiN, amorphous SiGe and amorphous GeN. In producing the composite member, a surface of a structural member is polished into a mirror-finished condition which is a finish condition by the usual mirror-finishing. The film layer of the amorphous material is then provided on the surface in the mirror-finished condition by plasma CVD process.

7 Claims, 2 Drawing Sheets

+ Ions

METHOD OF IMPROVING THE CORROSION RESISTANCE OF A METAL

BACKGROUND OF THE INVENTION

This invention relates to a composit superior in corrosion resistance and having a structural member provided on its surface with a film layer of an amorphous material and a method for producing the composite member.

Various methods have been known to improve the corrosion resistance and gas emission property of metallic structural members. For example, surfaces of a structural member are treated by electropolishing or formed with a passive film, or formed with a film such as amorphous SiC, amorphous SiN or the like.

Among the above known methods, in order to form passive film, a structural member of a stainless steel is heated in an oxidizing atmosphere. In case of a structural member of aluminum, it is treated by fluorine to form a passive film.

However, the passive film formed by oxidizing the surface of the stainless steel is very thin on the order of a few hundred Å, so that a corrosive material penetrates into the film in a short period of time to shorten the service life of the composite member. Moreover, in order to improve the corrosion resistance, even if a surface treatment is performed for increasing the ratio of the number of chromium atoms, such a treatment has a limitation in effect because the oxidized surface film includes iron oxide and chromium oxide without exception.

On the other hand, the film layers of amorphous materials do not encounter the above problems. However, in the event that the film layer of an amorphous SiC, SiN or the like is formed on the surface of a metallic structural member which has been worked in a usual manner by cutting with a lathe, milling machine or the like, some crystal grains of the metallic structural member are likely to fall off in grinding after the cutting. Therefore, pin holes are formed in the film layer at the locations from which the crystal grains have fallen off. Under the existence of the pin holes, there is a tendency for the corrosive-resistant film layer to be peeled away from the structural member in conjunction with the action of corrosives.

SUMMARY OF THE INVENTION

It is a principal object of the invention to provide a composite member superior in corrosion resistance, particularly, to liquids and a method for producing such a composite member to overcome the difficulties described above.

In order to accomplish this object, the composite member according to the invention comprises a structural member having a surface in a mirror-finished condition and a film layer of an amorphous material provided on the surface.

Moreover, the method for producing a composite member according to the invention comprises steps of working a surface of a structural member into a mirror condition on which a film layer is to be provided, and forming the film layer on the surface in the mirror condition by plasma CVD process.

The known plasma chemical vapor deposition process is referred to herein as "plasma CVD process".

The film layer of an amorphous material is provided on the mirror-finished surface of a structural member according to the invention. Therefore, it is possible to provide a film layer on the perfect surface of a structural member free from omission of crystal grains which would otherwise occur in grinding. Consequently, pin holes causing peeling of the film layer are completely eliminated according to the invention.

The term "mirror-finished condition" used herein is intended to designate a finished condition by the usual mirror-finishing. Moreover, the "mirror-finished condition" is concretely indicated as a surface condition that the number of holes of diameters more than 1 $\mu$m or flaws or scores of lengths more than 1 $\mu$m existing in a circular area of a radius of 100 $\mu$m in any portion of a finished metal surface is at the most one. It is preferable for the surface condition that the number of holes of diameters more than 1 $\mu$m or flaws or scores of lengths more than 1 $\mu$m existing in a circular area of a radius of 200 $\mu$m in any a finished metal surface is at the most one, and more preferably that the number of holes of diameters more than 1 $\mu$m or flaws or scores of lengths more than 1 $\mu$m existing in a circular area of a radius of 400 $\mu$m in any portion of a finished metal surface is at the most one.

By using the plasma CVD process, plasma is produced to decompose a raw gas at low temperatures so that an amorphous film layer is formed at the low temperatures. As a result, low melting point metals can be used as structural members. This is the reason why the plasma CVD process is used in the method according to the invention.

In carrying out the plasma CVD process, it is preferable to arrange a structural member on the cathode side or to apply negative voltage to the structural member. In this manner, ions impinge against the structural member so that a stronger film layer is advantageously fixed to the surface of the structural member.

A film layer of an amorphous material used herein unavoidably contains impurities, such as hydrogen, halogens or the like.

The invention will be more fully understood by referring to the following detailed specification and claims taken in connection with the appended drawings.

DESCRIPTION OF THE PREFERRED EMBODIMENTS

Figure 1:
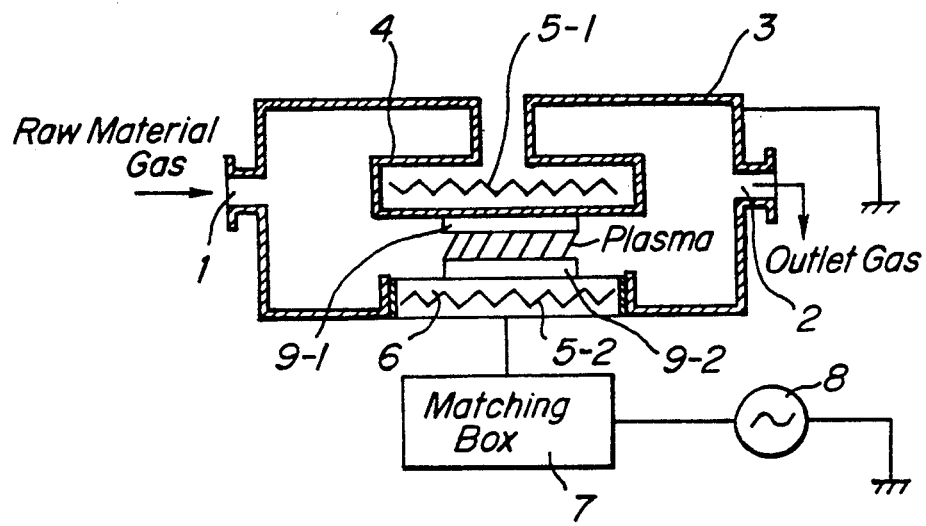
FIG. 1 is a schematic conceptional view for explaining one embodiment of the method for producing a composite member according to the invention.

In the drawings, the following reference numerals identify the following components:

1 . . . gas inlet
2 . . . gas outlet
3 . . . vessel
4 . . . anode
5-1, 5-2 . . . heaters
6 . . . cathode
7 . . . matching box 8 . . . high frequency power source
9-1, 9-2 . . . specimens
20 . . . composite member
21 . . . O-ring
22 . . . cylindrical vessel
23 . . . concentrated hydrochloric acid In the embodiment shown in FIG. 1, a vessel 3 having a gas inlet 1 and a gas outlet 2 is used as a plasma CVD apparatus. In this embodiment, there are provided in the vessel 3 an anode 4 and a heater 5-1 on the upper side and a cathode 6 and a heater 5-2 on the lower side viewed in FIG. 1. Moreover, a high frequency power source 8 having a matching box 7 is provided between the anode 4 and the cathode 6. In order to form film layers of an amorphous material with the plasma CVD apparatus shown in FIG. 1, surfaces of specimens 9-1 and 9-2 as structural members or substrates are polished to mirror-finished surfaces onto which film layers are to be provided. The specimens 9-1 and 9-2 are then arranged on the anode 4 and the cathode 6, respectively, such that the surfaces to which SiC film layers are to be deposited are in a face-to-face relationship. Thereafter, the specimens 9-1 and 9-2 are heated to 500° C. by the heaters 5-1 and 5-2.

Under this condition, a raw material gas consisting of a Si source raw material such as SiH₄ and a C source raw material such as CH₄ is supplied into the vessel 3 through the gas inlet 1, while the atmospheric gases in the vessel 3 are exhausted through the gas outlet 2. In sequence therewith, radio frequency power of, for example, 10 W is applied to the raw material gas in the vessel from the high frequency power source 8 to produce plasma, while the decomposed raw material gases are vapor-deposited to form film layers of an amorphous material on the specimens 9-1 and 9-2. The plasma is shown in oblique lines in the vessel 3 in FIGS. 1 and 2.

A method of mirror finishing to be used herein should be decided depending upon materials of structural members to which film layers are deposited. The following method is preferable, although which is only by way of example. A structural member is polished by an abrasive of #800 and then further polish by diamond abrasive grains of the order of 3 μm. Finally, the member is treated by buffing with an alumina paste of the order of 0.06 μm and then cleaned. As an alternative, after a structural member is treated by composite electropolishing, it is further treated by electropolishing and cleaned.

Figure 2:
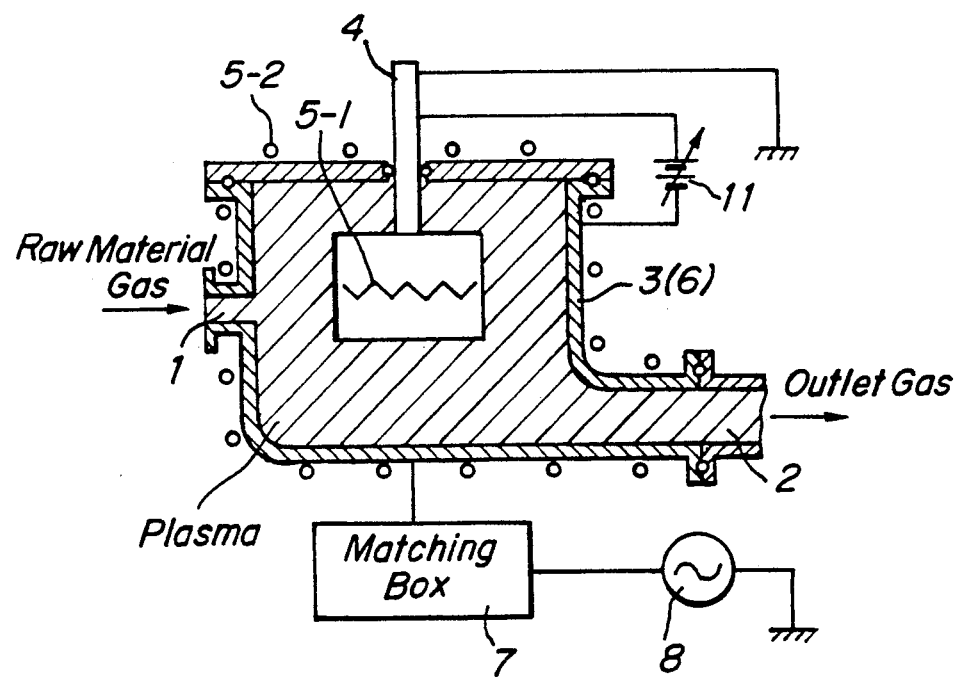
FIG. 2 is a schematic conceptional view for explaining another embodiment of the method for producing a composite member according to the invention.

FIG. 2 is a conceptional view for explaining another embodiment of the producing method according to the invention. In the embodiment shown in FIG. 2, film layers of an amorphous material are formed all over the inner surfaces of a vessel 3. Like components in FIG. 2 are designated by the same reference numerals as those in FIG. 1 and will not be described in further detail. The method shown in FIG. 2 is similar to that shown in FIG. 1 with exception of the following features. All the inner surfaces of the vessel 3 are polished into mirror-finished surfaces, and a direct current source 11 is arranged such that whole the vessel 3 to be coated by vapor deposition of the amorphous material constitutes a cathode 6. In this manner, plasma is produced all over the inner surfaces of the vessel 3 with the aid of the direct current from the anode 4 so that the inner surfaces are covered by film layers of the amorphous material.

EXAMPLE

Figure 3:
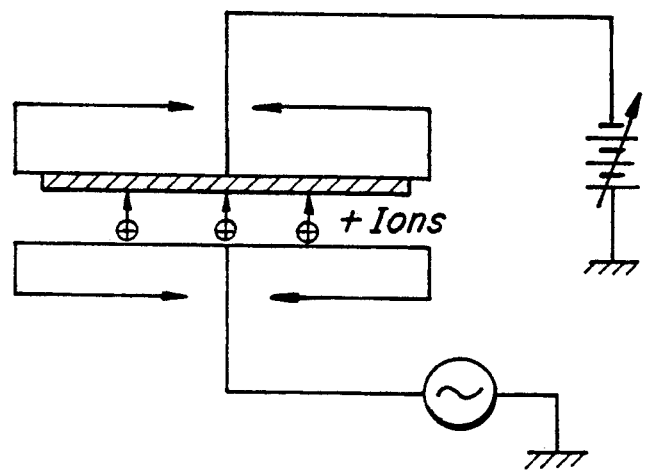
FIG. 3 is a schematic conceptional view for explaining how to apply negative bias in an embodiment of the method according to the invention.

An experiment was made to confirm corrosion resistance of composite members according to the invention and the prior art. Raw material gases as shown in Table 1 were used. The substrate temperature on the anode side was 300° C., while the substrate temperature on the cathode side was the room temperature. Specimens of the present invention were treated by electropolishing in sequence with composite electropolishing to obtain mirror-finished surfaces. As schematically shown in FIG. 3, negative bias was applied to the anode under a condition of radio frequency power of 10 W and gas pressure of 100 mm(torr) to obtain composite members Nos. 1 to 10 according to the present invention and composite members Nos. 1 to 5 of comparative examples.

Figure 4:
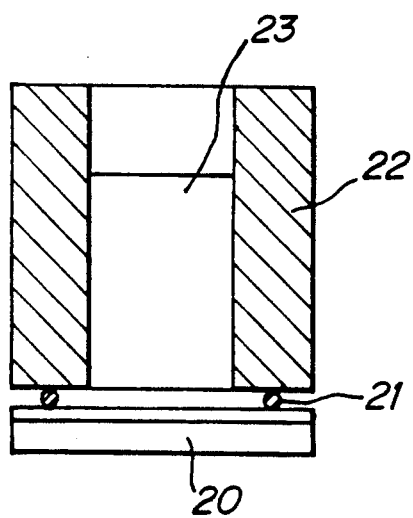
FIG. 4 is a schematic view for explaining an arrangement for carrying out corrosion resistance tests.

In order to examine the corrosion resistance of the obtained composite members, as schematically shown in FIG. 4 a cylindrical vessel 22 is arranged above a composite member 20 through an O-ring 21. Concentrated hydrochloric acid 23 of 35% concentration kept at 28° C. was poured into the cylindrical vessel 22. The time from the pouring of the hydrochloric acid to the moment when bubbles start to occur at surfaces of the film layers was measured. Results are shown in Table 1.

TABLE 1

| Specimen No. | | Kind of gas | | Position of specimen A: Anode C: Cathode | Applied bias voltage (V) | Kind of substrate | Substrate surface condition: radius of circular area having no more than one flaw more than 1 μm in size (μm) | Time until bubbling in HCl corrosion test | Remarks |
|---|---|---|---|---|---|---|---|---|---|
| Present invention | 1 | SiH₄ | CH₄ | C | 0 | Stainless steel | 200 | 60 min | |
| | 2 | SiH₄ | CH₄ | A | −100 | Stainless steel | 100 | 90 min | |
| | 3 | SiH₄ | CH₄ | C | 0 | Aluminum | 200 | 50 min | |
| | 4 | SiH₄ | CH₄ | A | −150 | Stainless steel | 200 | more than 90 min | |
| | 5 | SiH₄ | CH₄ | A | −100 | Glass | 200 | more than 90 min | |
| | 6 | SiH₄ | CH₄ | A | −150 | Aluminum | 200 | 60 min | |
| | 7 | SiH₄ | GeH₄ | A | −100 | Stainless steel | 200 | 60 min | |
| | 8 | SiH₄ | NH₃ | A | −100 | Stainless steel | 200 | more than 90 min | |
| | 9 | SiH₄ | CH₄ | A | −100 | Stainless steel | 400 | more than 180 min | |
| | 10 | SiH₄ | CH₄ | A | −100 | Stainless steel | 200 | more than 90 min | |
| Comparative example | 1 | SiH₄ | CH₄ | A | −150 | Aluminum | 50 | 5 sec | |
| | 2 | — | — | — | — | Stainless steel | 200 | 2 min | |
| | 3 | — | — | — | — | Aluminum | 200 | moment | |

TABLE 1-continued

| Specimen No. | Kind of gas | Position of specimen A: Anode C: Cathode | Applied bias voltage (V) | Kind of substrate | Substrate surface condition: radius of circular area having no more than one flaw more than 1 μm in size (μm) | Time until bubbling in HCl corrosion test | Remarks |
|---|---|---|---|---|---|---|---|
| 4 | SiH₄ CH₄ | A | −150 | Stainless steel | 50 | 5 min | |
| 5 | Air | — | — | Stainless steel | Unmeasured (mirror-finished surface) | 45 min | Composite electropolishing + surface oxidizing |

Substrate surface condition: radius of circular area having no more than one flaw more than 1 μm in size.

From the results shown in Table 1, in comparison with the composite members Nos. 1 to 10 according to the present invention, all the comparative example composite members Nos. 1 to 5 started to bubble in shorter time which indicated less corrosion resistance of the comparative examples. The specimens of the comparative examples Nos. 1 and 4 were provided with film layers of amorphous materials on usual polished surfaces of the specimens by plasma CVD process, while the specimens of the comparative examples Nos. 2, 3 and 5 had mirror-finished surfaces but did not have film layers thereon.

While the film layers of the amorphous SiC were formed by the plasma CVD process in the above Example, the similar effects according to the invention were obtained with other amorphous materials, for example, amorphous SiN, amorphous SiGe, amorphous GeN and the like.

As can be seen from the above explanation, according to the invention, a structural member is mirror-finished and the film layer of an amorphous material is provided on the mirror-finished surface by plasma CVD process to obtain a composite member superior in corrosion resistance.

According to the invention, the film layer of an amorphous material is formed on the mirror-finished surface of a structural member by the plasma CVD process. As a result, the film layer of the amorphous material can be formed on the structural member at a low temperature and therefore a composite member using a low melting point material can be produced.

The invention can provide composite members superior in corrosion resistance to those formed with corrosion resistant films on usually polished metallic surfaces or those treated to obtain surface passivity. According to the invention, therefore, it is possible to improve the corrosion resistance of metals which are for structural materials superior in workability. Consequently, the composite member according to the invention is applicable to a chemical vapor deposition apparatus or the like.

While the invention has been particularly shown and described with reference to preferred embodiments thereof, it will be understood by those skilled in the art that the foregoing and other changes in form and details can be made therein without departing from the spirit and scope of the invention.

We claim:

1. A method for improving the corrosion resistance of a metal member, comprising the steps of:
   working a surface of the metal member to a surface condition such that the number of defects more than 1 μm in size existing in a circular area of a radius of 100 μm in any portion of said surface is no more than one; and
   forming a film layer on said surface by plasma CVD process, said film layer comprising at least one material selected from the group consisting of amorphous SiC, amorphous SiN, amorphous SiGe and amorphous GeN.

2. The method of claim 1, wherein inner surfaces of a vessel constructed as a cathode are finished in said surface condition and plasma is produced all over said inner surfaces.

3. The method of claim 1, wherein metal members are arranged on an anode and a cathode, respectively, in a vessel filled with a raw material gas, and radio frequency power is applied to the raw material gas in the vessel to produce plasma.

4. The method for of claim 1, wherein said metal member is arranged on the side of a cathode in forming said film layer by the plasma CVD process.

5. The method of claim 1, wherein negative voltage is applied to said metal member in forming said film layer by the plasma CVD process.

6. The method for of claim 1, wherein said circular area has a radius of 400 μm worked surface is at the most one.

7. The method of claim 1, wherein said circular area has a radius of 200 μm.

* * * * *